(12) United States Patent
Basker et al.

(10) Patent No.: US 9,508,818 B1
(45) Date of Patent: Nov. 29, 2016

(54) METHOD AND STRUCTURE FOR FORMING GATE CONTACT ABOVE ACTIVE AREA WITH TRENCH SILICIDE

(71) Applicant: International Business Machines Corporation, Armonk, NY (US)

(72) Inventors: Veeraraghavan S. Basker, Schenectady, NY (US); Kangguo Cheng, Schnectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/929,753

(22) Filed: Nov. 2, 2015

(51) Int. Cl.
| | |
|---|---|
| *H01L 29/45* | (2006.01) |
| *H01L 29/40* | (2006.01) |
| *H01L 21/02* | (2006.01) |
| *H01L 21/311* | (2006.01) |
| *H01L 29/66* | (2006.01) |
| *H01L 29/78* | (2006.01) |

(52) U.S. Cl.
CPC ......... *H01L 29/45* (2013.01); *H01L 21/02115* (2013.01); *H01L 21/31116* (2013.01); *H01L 29/401* (2013.01); *H01L 29/665* (2013.01); *H01L 29/78* (2013.01)

(58) Field of Classification Search
None
See application file for complete search history.

(56) References Cited

U.S. PATENT DOCUMENTS

| | | |
|---|---|---|
| 6,660,581 B1 | 12/2003 | Yang et al. |
| 6,677,205 B2 | 1/2004 | Beintner |
| 7,488,650 B2 | 2/2009 | Schulz |
| 7,888,252 B2 | 2/2011 | Faltermeier et al. |
| 8,563,425 B2 | 10/2013 | Schultz |
| 8,703,550 B2 | 4/2014 | Doris et al. |
| 8,937,359 B2 | 1/2015 | Xie et al. |
| 9,006,834 B2 | 4/2015 | Schultz |
| 9,349,812 B2 * | 5/2016 | Chen ................. H01L 21/76897 |
| 2014/0099773 A1 | 4/2014 | Doris et al. |

* cited by examiner

*Primary Examiner* — Scott B Geyer
(74) *Attorney, Agent, or Firm* — Cantor Colburn LLP; Vazken Alexanian

(57) ABSTRACT

A semiconductor device includes a substrate including an active area; a gate formed on the active area and surrounded by a spacer along a sidewall; a first source/drain contact and a second source/drain contact positioned on opposing sides of the gate and in contact with the active area; a first recess formed in the first source/drain contact and a second recess formed in the second source/drain contact; a gate contact including a conductive material on and in contact with the gate and the spacer; and an insulating liner disposed along a sidewall of the gate contact and in the first recess in the first source/drain contact and the second recess in the second source/drain contact.

6 Claims, 7 Drawing Sheets

METHOD AND STRUCTURE FOR FORMING GATE CONTACT ABOVE ACTIVE AREA WITH TRENCH SILICIDE

BACKGROUND

The present invention relates to metal-oxide-semiconductor field-effect transistors (MOSFET), and more specifically, to contact structures in MOSFET devices.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

SUMMARY

According to an embodiment, a method of making a semiconductor device includes forming a gate on an active area of a substrate, a gate spacer positioned along a sidewall of the gate, and a gate cap disposed on a surface of the gate; forming a first source/drain contact and a second source/drain contact on opposing sides of the gate and in contact with the active area and gate spacer; disposing an interlayer dielectric (ILD) on the gate and first and second source/drain contacts; removing a portion of the ILD to form a gate contact opening over the gate; removing a portion of the first source/drain contact to form a first recess and a portion of the second source/drain contact to form a second recess; depositing a conformal layer of an insulating material along sidewalls of the gate contact opening and in the first recess and the second recess; removing the insulating material from a surface of the gate cap; removing the gate cap to expose the gate; and depositing a conductive material in the gate contact opening and on an exposed surface of the gate to form a gate contact.

According to another embodiment, a method of making a semiconductor device includes forming a gate on an active area of a substrate, a gate spacer positioned along a sidewall of the gate, and a gate cap disposed on a surface of the gate; forming a first source/drain contact and a second source/drain contact on opposing sides of the gate and in contact with the active area and gate spacer; disposing an interlayer dielectric (ILD) on the gate and first and second source/drain contacts; removing a portion of the ILD to form a gate contact opening over the gate; recessing the first source/drain contact to form a first recess and the second source/drain contact to form a second recess by employing an etch process that does not substantially remove the gate cap and the gate spacer; depositing a conformal layer of an insulating material on a surface of the gate cap, along sidewalls of the gate contact opening, and within the first recess and the second recess; removing the insulating material from the surface of the gate cap; removing the gate cap to expose the gate; and depositing a conductive material in the gate contact opening and on an exposed surface of the gate to form a gate contact.

Yet, according to another embodiment, a semiconductor device includes a substrate including an active area; a gate formed on the active area and surrounded by a spacer along a sidewall; a first source/drain contact and a second source/drain contact positioned on opposing sides of the gate and in contact with the active area; a first recess formed in the first source/drain contact and a second recess formed in the second source/drain contact; a gate contact including a conductive material on and in contact with the gate and the spacer; and an insulating liner disposed along a sidewall of the gate contact and in the first recess in the first source/drain contact and the second recess in the second source/drain contact.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-1B illustrate a semiconductor device that may have shorting between the gate contact and source/drain contacts, in which:

FIG. 1A is a top view of source/drain contacts between gates; and

FIG. 1B is a cross-sectional side view through the A-A axis of FIG. 1A;

FIGS. 2A-2B illustrate a semiconductor device with an insulating liner between the gate contact and the source/drain contacts according to various embodiments, in which:

FIG. 2A is a top view; and

FIG. 2B is a cross-sectional side view through the A-A axis of FIG. 2A;

FIGS. 3A-9 illustrate methods of making the semiconductor devices shown in FIGS. 2A-2B according to various embodiments, in which:

FIG. 3A is a top view of source/drain contacts between gates;

FIG. 3B is a cross-sectional side view through the A-A axis of FIG. 3A;

FIG. 4A is a top view after depositing an ILD on the gates and forming a gate contact opening in the ILD;

FIG. 4B is a cross-sectional side view through the A-A axis of FIG. 4A;

FIG. 5 is a cross-sectional side view after recessing the source/drain contacts;

FIG. 6 is a cross-sectional side view after depositing an insulating liner in the gate contact opening and the recesses in the source/drain contacts;

FIG. 7 is a cross-sectional side view after removing the ILD from the surface of the ILD and on the gate cap;

FIG. 8 is a cross-sectional side view after removing the gate cap; and

FIG. 9 is a cross-sectional side view after depositing a conductive material in the gate contact opening to form the gate contact.

DETAILED DESCRIPTION

Trench silicides are used for source/drain contacts in some semiconductor devices, e.g., 10 nm and beyond. Having the gate contact (CB) above/over the active area (RX), instead of outside the active area, is advantageous because adjacent devices may be spaced closer together. However, one challenge of forming a gate contact over the active area is that the gate contact may electrically short with the source/drain contact.

Figure 1A:
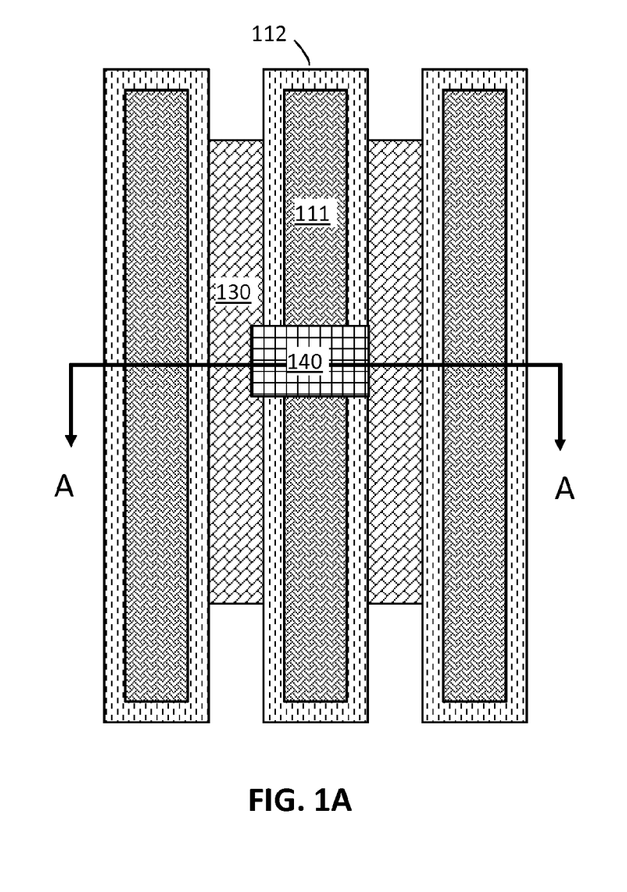
Figure 1B:
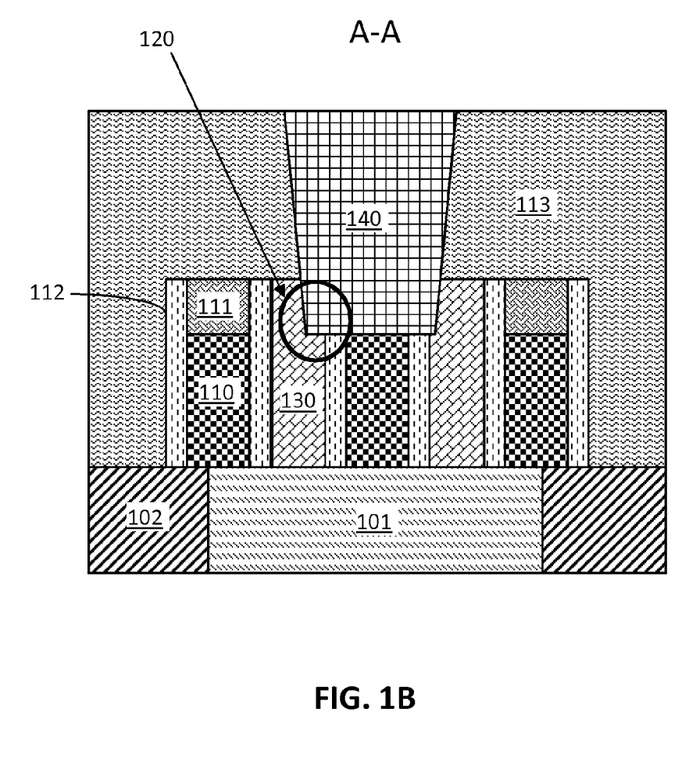

For example, FIGS. 1A-1B illustrate a semiconductor device that may have shorting in the region 120 between the gate contact 140 and source/drain contacts 130. FIG. 1A is a top view showing source/drain contacts 130 between gates 111. FIG. 1B is a cross-sectional side view through the A-A axis of FIG. 1A. For clarity, the ILD 113 shown in FIG. 1B is not shown in FIG. 1A.

Gates 110 are disposed on a substrate that includes an active area 101 (channel region and source/drain regions) and shallow trench isolation (STI) regions 102 (as shown in FIG. 1B). The gates 110 include spacers 112 along sidewalls and are covered with gate caps 111. Source/drain contacts 130 are formed between the gates 110 and in contact with the active area 101. An interlayer dielectric (ILD) 113 is disposed on and around the gates 110.

A gate contact 140 is formed in a trench within the ILD 113 over the active area 101 after the gate cap 111 is removed. The gate contact 140 is self-aligned to the gate 110 in, for example, 10 nm devices and beyond. When the gate contact 140 contacts the gate 110, it may contact the source/drain contact 130 in the region 120 and cause shorting. Accordingly, there is a need to provide a device and methods that enable the gate contact 140 to be positioned above the active area 101 without shorting with the source/drain contacts 130.

Accordingly, various embodiments provide semiconductor devices and methods of making semiconductor devices with gate contact structures over active areas without shorting with the source/drain contacts. In some embodiments, the source/drain contact is recessed after the gate contact trench is formed in the ILD. An insulating liner is deposited in the recessed areas. The insulating liner prevents shorting between the gate contact and the source/drain contacts, while still enabling the gate contact to be above the active area to reduce device cell sizes. No additional mask is needed to create the liner. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 2A:
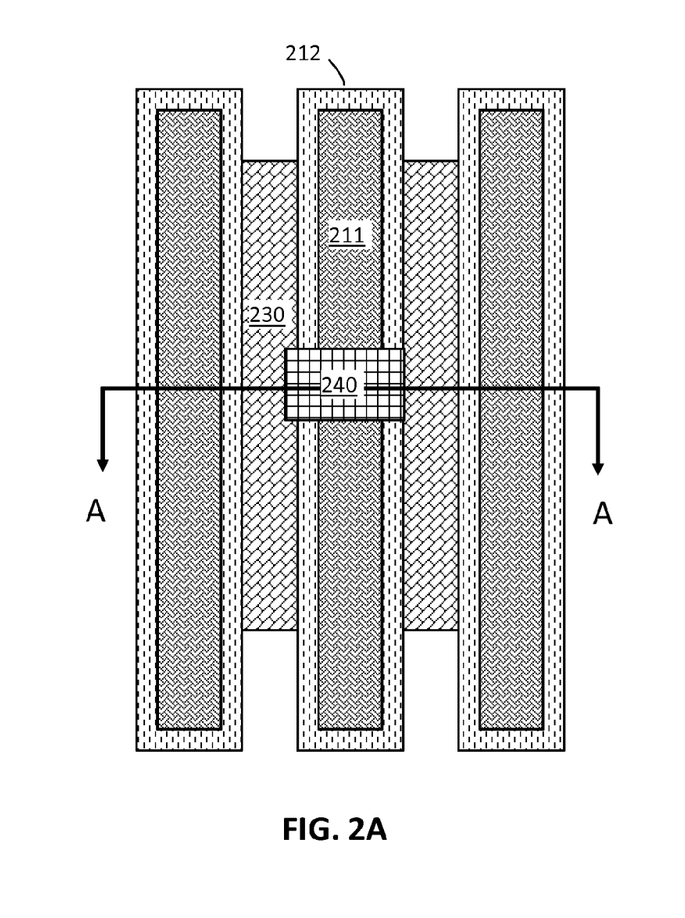
Figure 2B:
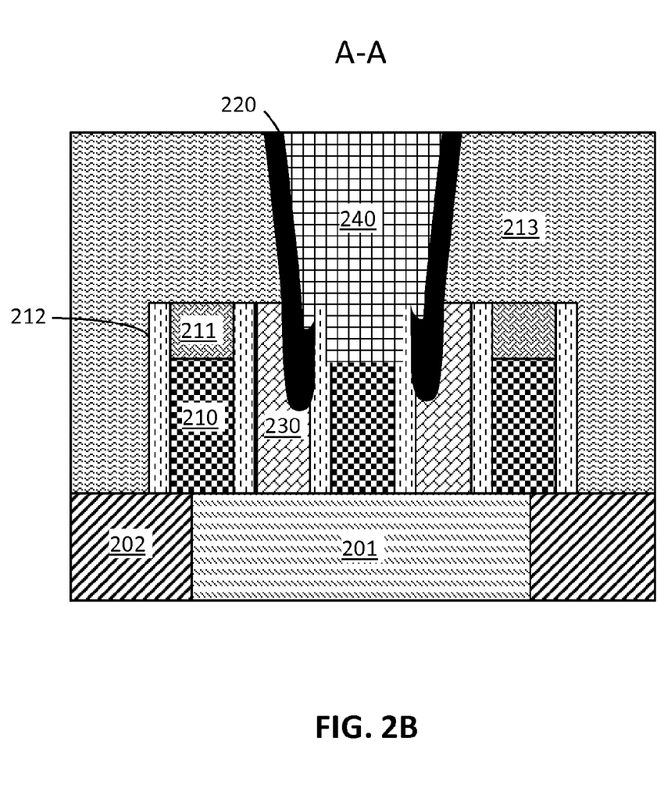

Turning again to the Figures, FIGS. 2A-2B illustrate a semiconductor device with an insulating liner 220 positioned between the gate contact 240 and the source/drain contacts 130 according to various embodiments. FIG. 2A is a top view. FIG. 2B is a cross-sectional side view through the A-A axis of FIG. 2A. For clarity, the ILD 213 shown in FIG. 2B is not shown in FIG. 1B. FIGS. 2A and 2B are described in detail below in FIGS. 3A-9.

Gates 210 are disposed on a substrate that includes an active area 201 (channel region and source/drain regions) and shallow trench isolation (STI) regions 202 (shown in FIG. 2B). The gates 210 include spacers 212 (gate spacers) along sidewalls and are covered with gate caps 211. Source/drain contacts 230 are formed between the gates 210 and are in contact with the active area 201. The source/drain contacts 230 extend from the active area 201, along the spacers 212, and to the level of the gate caps 211. An ILD 213 is disposed on and around the gates 210.

To form the gate contact 240, a trench (opening) is formed within the ILD 213 over a gate 110. The source/drain contacts 230 are recessed, and the gate cap 211 is removed beneath the trench. An insulating liner 220 is deposited in the recessed areas of the source/drain contacts 230 and along sidewalls of the trench within the ILD 213. The trench is filled with a conductive material to form the gate contact 240 over the active area 201. The gate contact 240 is self-aligned to the gate 210. The insulating liner 220 prevents shorting between the gate contact 240 and the source/drain contacts 230 (compare FIG. 1B showing shorting in region 120).

Figure 3A:
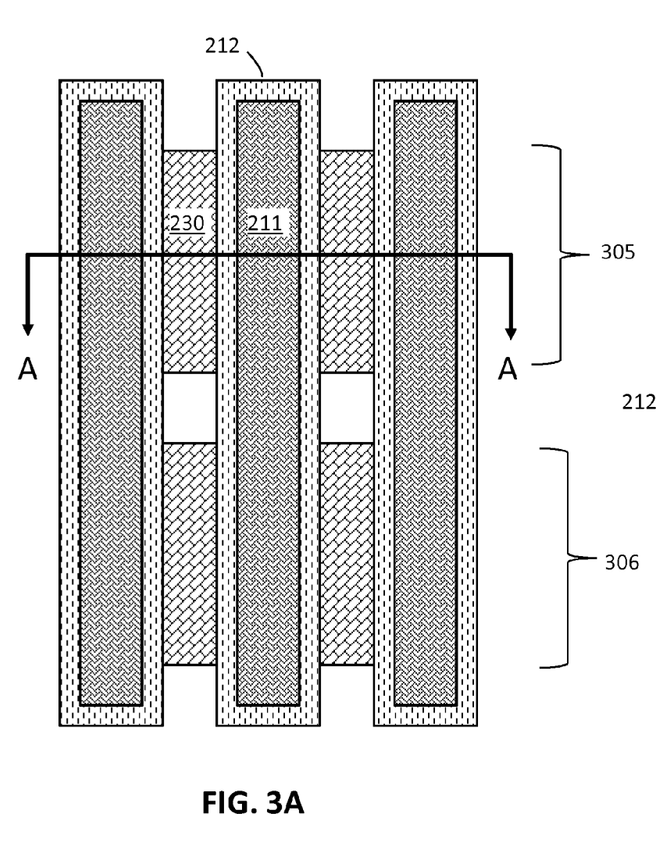

FIGS. 3A-7 illustrate methods of making the semiconductor devices shown in FIGS. 2A-2B according to various embodiments. FIG. 3A is a top view of source/drain contacts 230 between gates 210. The semiconductor device includes a first transistor 305 and a second transistor 306. FIG. 3B is a cross-sectional side view through the A-A axis of FIG. 3A. Although the following methods are described with reference to the first transistor 305, they may be employed with both first and second transistors 305, 306.

Figure 3B:
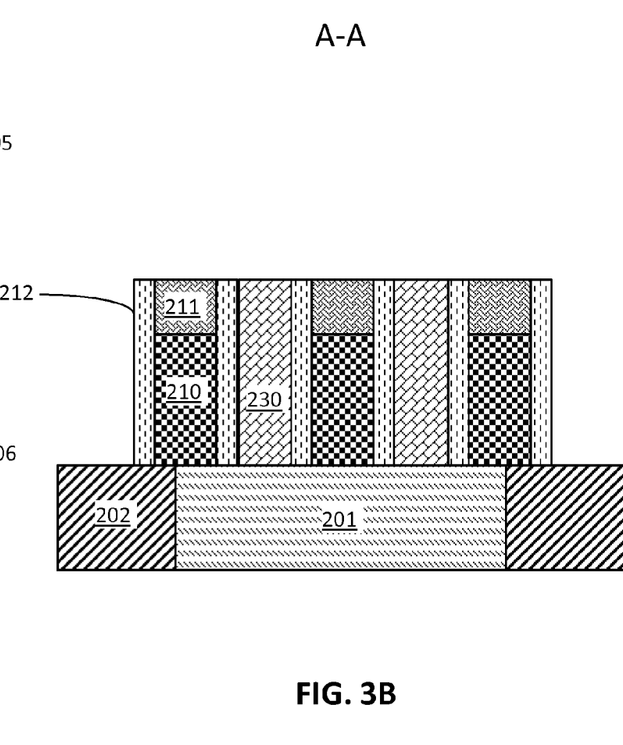

The substrate forming the active area 201 may be formed from semiconductor materials. Non-limiting examples of substrate materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof.

Other examples of suitable substrates include silicon-on-insulator (SOI) substrates with buried oxide (BOX) layers. A SOI wafer may include a thin layer of a semiconducting material (e.g., silicon, silicon germanium, germanium, or III-V compound semiconductors) on an insulating layer (i.e., an oxide layer) which is in turn disposed on a silicon substrate.

In some embodiments, the substrate of the first transistor 305 is the same or different than the substrate of the second transistor 306. For example, the substrate of the first transistor 305 may include silicon when the first transistor 305 is an NFET, and the substrate of the second transistor 306 may include silicon germanium when the second transistor 306 is a PFET.

In some embodiments, the semiconductor device may be a FinFET device. In other embodiments, the semiconductor device may be a planar FET device. When the device is a FinFET, fins (not shown) may be formed in the substrate before forming the gates 210, described below.

A STI process is performed to form the STI regions 202 in the substrate. The STI regions 202 are isolation regions formed by etching trenches in the substrate and then filling the trenches with at least one dielectric material, for example, silicon dioxide ($SiO_2$). Other non-limiting examples of suitable dielectric materials for the STI regions 202 include tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof.

Gates 210 are formed on the active area 101 of the substrate. The gates 210 include gate stacks that may include, for example, one or more dielectric materials, one or more workfunction metals, and one or more metal gate conductor materials. The gate dielectric material(s) may be a dielectric material having a dielectric constant greater than 3.9, 7.0, or 10.0. Non-limiting examples of suitable materials for the gate dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used.

The work function metal(s) may be disposed over the gate dielectric material. The type of work function metal(s) depends on the type of transistor and may differ between the first and second transistors 305, 306. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal may deposited over the gate dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal.

The gates 210 are surrounded by an insulating liner material that forms spacers 212 along gate sidewalls. The material forming the spacers 212 may be a dielectric spacer material. Non-limiting examples of materials for the spacers 212 include dielectric oxides (e.g., silicon oxide), dielectric nitrides (e.g., silicon nitride), dielectric oxynitrides, SiOCN, or SiBCN, or any combination thereof. The spacer 212 material is deposited by a deposition process, for example, chemical vapor deposition (CVD) or physical vapor deposition (PVD). The spacer 212 material may be etched by a dry etch process, for example, a RIE process.

A gate cap 211 is formed on the gates 210 by depositing an insulating hard mask material. The gate cap 211 may include, for example, silicon nitride, SiOCN, SiBCN, or any combination thereof. The material forming the gate cap 211 may be deposited using a deposition process, including, but not limited to, PVD, CVD, PECVD, or any combination thereof.

The active area 201 (source/drain and channel region) is formed in the substrate. The active area 201 may be formed by, for example, incorporating dopants into the substrate. The active area 201 also may be formed by performing an epitaxial growth process is performed to deposit a crystalline layer onto a crystalline substrate beneath. Epitaxial material may be grown using vapor-phase epitaxy (VPE), molecular-beam epitaxy (MBE), liquid-phase epitaxy (LPE), or other suitable process. The epitaxial material, for example, silicon, silicon germanium, and/or carbon doped silicon (Si:C) silicon, may be doped during deposition by adding a dopant or impurity to form a silicide.

Source/drain contacts 230 are formed on the active area 201. The source/drain contacts 230 may include a low contact resistance liner along sidewalls and be in contact with spacers 212. The low contact resistance liner may include, for example, titanium, titanium nitride, tantalum, tantalum nitride, tungsten, niobium, cobalt, cobalt titanium, nickel, platinum, or any combination thereof. The low contact resistance liner may be formed by any suitable deposition method. Non-limiting examples of suitable deposition methods include chemical vapor deposition (CVD), physical vapor deposition (PVD), atomic layer deposition (ALD), or any combination thereof.

The source/drain contacts 230 may include a silicide disposed over the low contact resistance liner. The silicide may be formed by depositing a metal layer by a deposition process, for example, chemical vapor deposition CVD, PVD, ALD, or any combination thereof. The metal layer may include conductive metals and/or refractory metals. A silicidation process is performed to form a metal silicide in the source/drain contacts 230. A conductive material may then be disposed on the metal silicide.

Figure 4A:
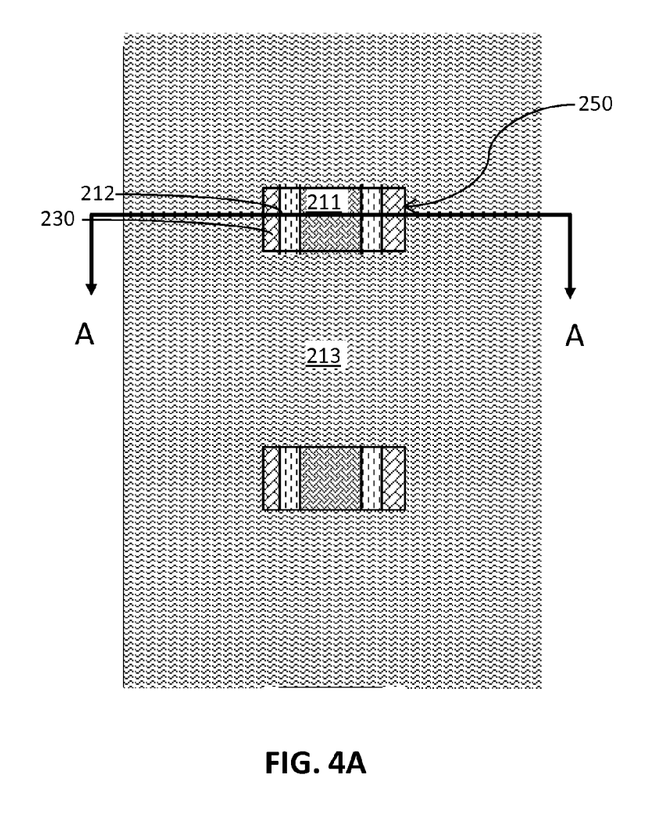
Figure 4B:
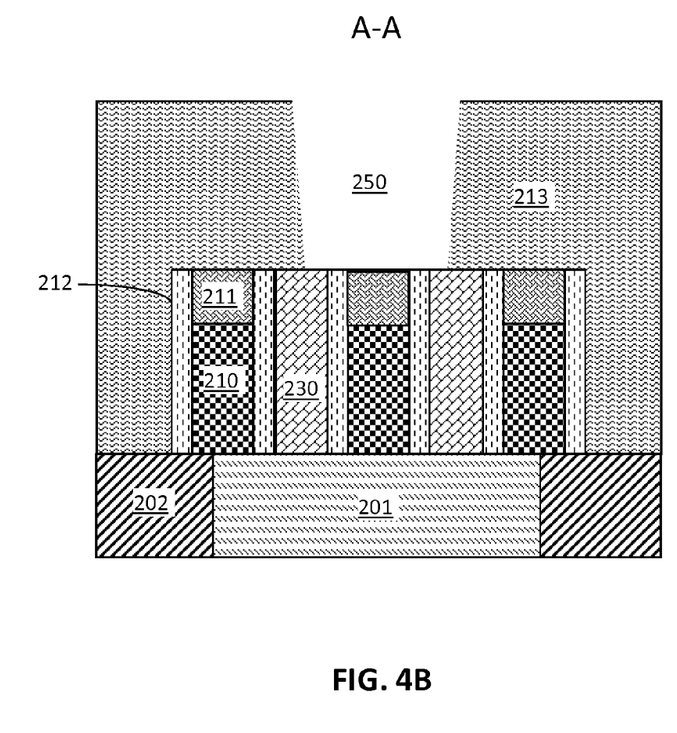

FIG. 4A is a top view after depositing an ILD 213 on the gates 210 and forming a gate contact trench 250 (opening) in the ILD 213. The ILD 213 covers and surrounds the gates 210. For clarity, the ILD 213 is not shown in FIG. 4A.

The ILD 213 may be formed from a low-k dielectric material (with k<4.0), for example, a low-k dielectric oxide, including but not limited to, silicon dioxide, spin-on-glass, a flowable oxide, a high density plasma oxide, borophosphosilicate glass (BPSG), or any combination thereof. The ILD 213 may deposited by a deposition process, including, but not limited to CVD, PVD, plasma enhanced CVD, atomic layer deposition (ALD), evaporation, chemical solution deposition, or like processes.

The gate contact trench 250 is formed in the ILD 213 by removing a portion of the ILD 213 to form an opening extending through the ILD 213 to the gate cap 211. The gate contact trench 250 exposes the gate cap 211, surrounding spacers 212, and a portion of the source/drain contacts 230. A portion of the gate contact trench 250 may be wider than the gate 210 surrounded by the spacers 212.

The gate contact trench 250 may be formed by performing an etching process to remove a portion of the ILD 213. The gate contact trench 250 may be formed by depositing a mask (not shown), for example a photoresist, on the ILD 213. The mask is patterned, and the pattern is transferred into the ILD 231 by removing a portion of the ILD 213 material down to the level of the gate cap 211. The ILD 213 material may be removed by a suitable etching process, for example, a reactive ion etch (RIE) process. The mask is removed after forming the gate contact trenches 250.

Figure 5:
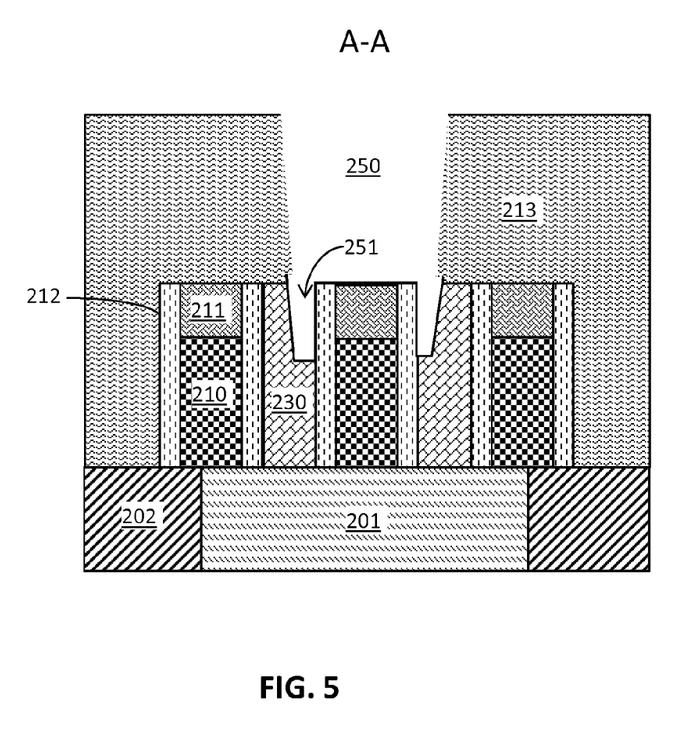

FIG. 5 is a cross-sectional side view after recessing the source/drain contacts 230 around the gates 210 to form recesses 251. The source/drain contacts 230 are recessed by performing a selective etch process. The selective etch process creates openings/recesses 251 in the source/drain contacts 230. In some embodiments, a first source/drain contact 230 is recessed to form a first recess and a second source/drain contact 230 is recessed to form a second recess.

The recesses 251 (first and second recesses) contact the spacers 212 around the gate 210. The recesses 251 have a depth of at least 10 nm (at least 10 nm of the source/drain contacts 230 are removed). In some embodiments, the recesses 251 have a depth in a range from about 10 to about 50 nm.

The recess process is selective to the gate cap 211 and the spacers 212 (the etch process will not remove them). The recess process may be, for example, a reactive ion etch (RIE) process with an etchant including chlorine. Alternatively, the source/drain contacts 230 may be recessed by an isotropic etching process, for example, a wet etch process including hydrochloride acid and hydrogen peroxide.

Figure 6:
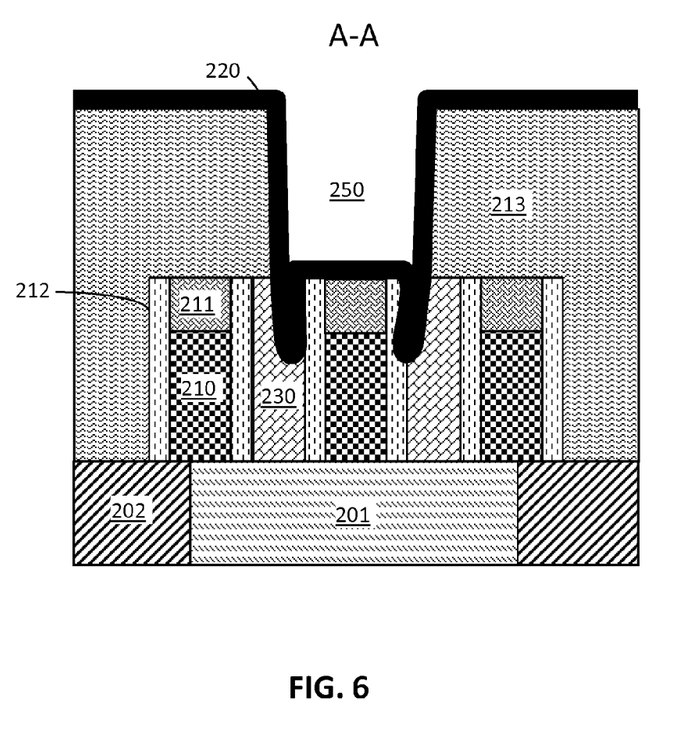

FIG. 6 is a cross-sectional side view after depositing an insulating liner 220 in the gate contact trench 250 and the recesses 251. The insulating liner 220 is deposited as a conformal liner layer. The conformal liner layer fills the recesses 251 in the source/drain contacts 230, lines the sidewalls of the gate contact trench 250, and covers the exposed gate cap 211 and spacers 212. The insulating liner 220 may be deposited by a suitable deposition process, which depends on the type of material, for example, CVD, PVD, plasma enhanced CVD, atomic layer deposition (ALD), evaporation, chemical solution deposition, or like processes.

The insulating liner 220 may include, for example, amorphous carbon. Other non-limiting examples of materials for the insulating liner 220 include silicon nitride, silicon oxide, silicon dioxide, aluminum oxide, SiBCN, SiOCN, or a combination thereof.

The thickness of the insulating liner 220 may generally vary and is not intended to be limited. In some embodiments, the thickness of the insulating liner 220 is in a range from about 2 to about 10 nm. In other embodiments, the thickness of the insulating liner 220 is in a range from about 4 to about 6 nm.

Figure 7:
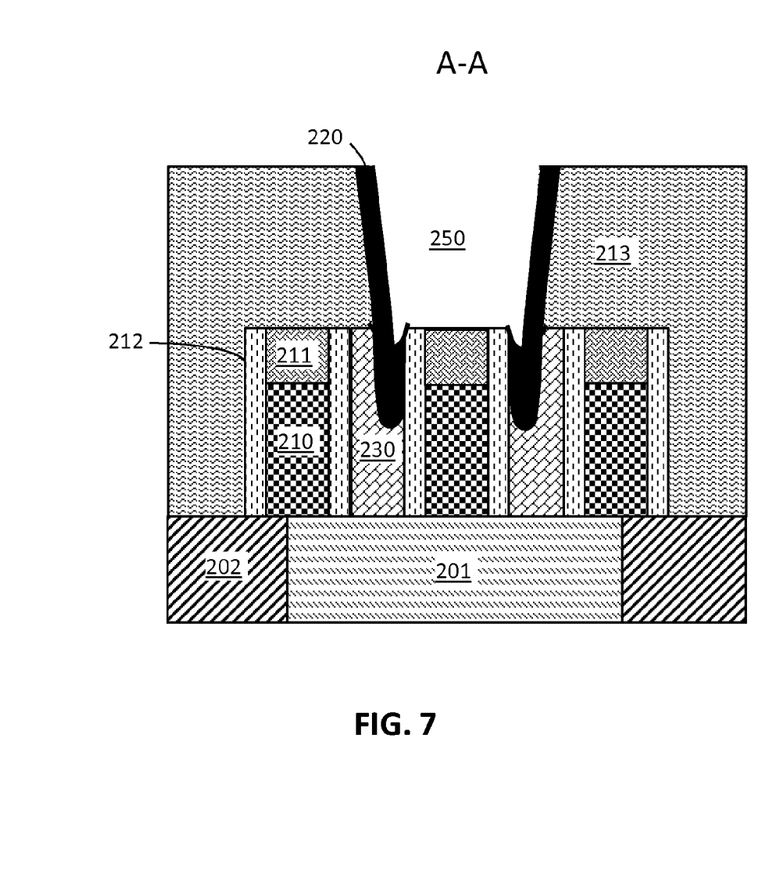

FIG. 7 is a cross-sectional side view after removing the insulating liner 220 from horizontal surfaces. The insulating liner 220 is removed from the surface of the ILD 213, the gate cap 211, and the spacers 212. The insulating liner 220 remains in the recesses 251 and along sidewalls of the gate contact trench 250. During the process of removing the insulating liner 220 from the horizontal surfaces, a portion may be removed from within the recesses 251. The insulating liner 220 may be removed by performing a dry etch process, for example, a RIE process.

Figure 8:
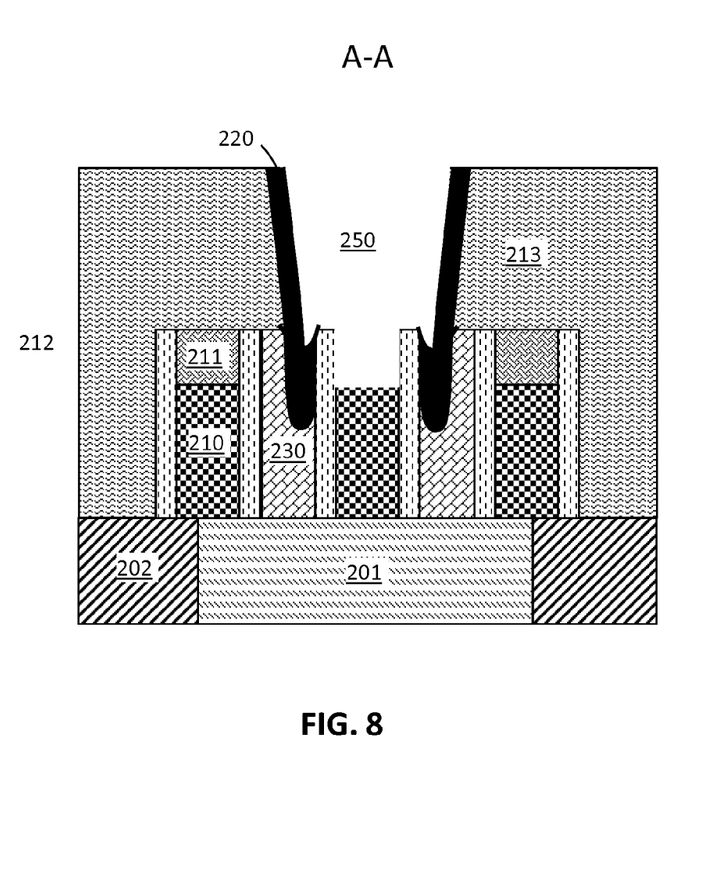

FIG. 8 is a cross-sectional side view after removing the gate cap 211. The gate cap 211 is removed to expose the gate 210. The gate cap 211 may be removed by performing an etch process that is selective to (will not remove) the insulating liner 220. The etch process may be a dry etch process, for example, a RIE process, that is selective to (will not remove) the gate cap 211 material.

Figure 9:
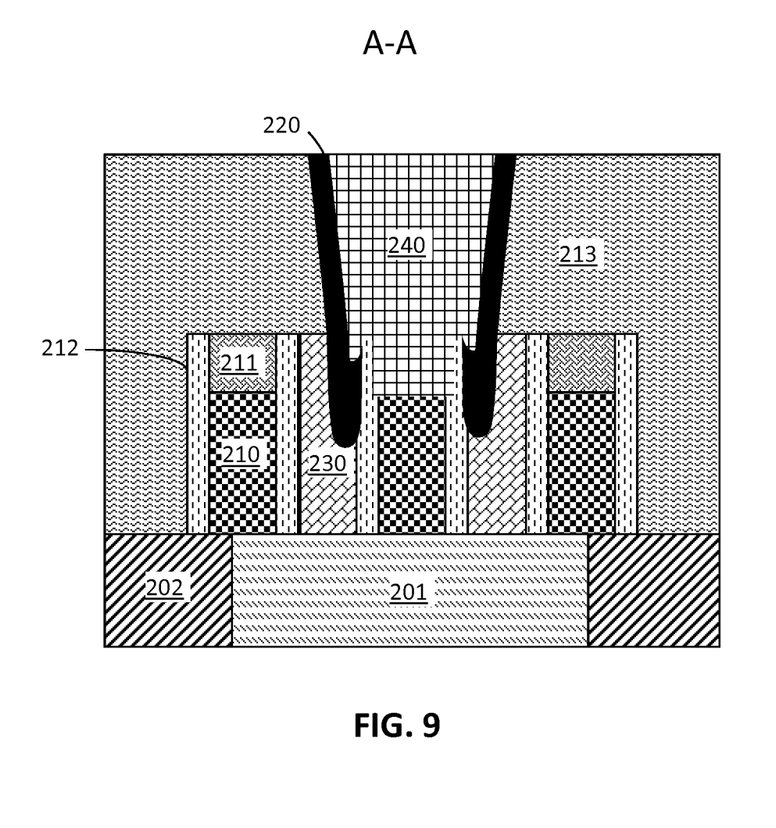

FIG. 9 is a cross-sectional side view after depositing a conductive material in the gate contact trench 250 to form the gate contact 240. The conductive material fills the gate contact trench 250, fills the space where the gate cap 211 was removed, and contacts the gate 210. The insulating liner 220 electrically isolates the gate contact 240 from the source/drain contacts 230. The gate contact 240 extends over the spacers 212. The insulating liner 220 in the recesses 251 extends below the gate contact 240. In some embodiments, a portion of the gate contact 240 may extend into the recesses 251 formed in the source/drain contacts 230.

The conductive material filling the gate contact 240 may be a conductive metal, for example, aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, or sputtering. A planarization process, for example, chemical mechanical planarization (CMP) is performed to remove any conductive material from the surface of the ILD 213.

As described above, various embodiments provide semiconductor devices and methods of making semiconductor devices with gate contact structures over active areas without shorting with the source/drain contacts. In some embodiments, the source/drain contact is recessed after the gate contact trench is formed in the ILD. An insulating liner is deposited in the recessed areas. The insulating liner prevents shorting between the gate contact and the source/drain contacts, while still enabling the gate contact to be above the active area to reduce device cell sizes. No additional mask is needed to create the liner.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
    a substrate comprising an active area;
    a gate formed on the active area and surrounded by a spacer along a sidewall;
    a first source/drain contact and a second source/drain contact positioned on opposing sides of the gate and in contact with the active area;
    a first recess formed in the first source/drain contact and a second recess formed in the second source/drain contact;
    a gate contact comprising a conductive material on and in contact with the gate and the spacer; and
    an insulating liner disposed along a sidewall of the gate contact and in the first recess in the first source/drain contact and the second recess in the second source/drain contact.

2. The semiconductor device of claim 1, wherein the first recess and the second recess have a depth in a range from about 10 to about 30 nanometers (nm).

3. The semiconductor device of claim 1, wherein the insulating liner contacts the spacer and extends below the gate contact.

4. The semiconductor device of claim 1, wherein the gate contact extends over the spacer.

5. The semiconductor device of claim 1, wherein a portion of the gate contact extends into the first recess and the second recess.

6. The semiconductor device of claim 1, wherein the insulating liner comprises amorphous carbon.

\* \* \* \* \*